(12) United States Patent
Xiong et al.

(10) Patent No.: US 12,267,067 B2
(45) Date of Patent: Apr. 1, 2025

(54) TRANSCEIVER CIRCUIT, AND CHIP AND TERMINAL DEVICE THAT USE TRANSCEIVER CIRCUIT

(71) Applicant: Huawei Technologies Co., Ltd., Shenzhen (CN)

(72) Inventors: Furong Xiong, Shanghai (CN); Kai Li, Shenzhen (CN); Wei Song, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/493,098

(22) Filed: Oct. 24, 2023

(65) Prior Publication Data

US 2024/0072789 A1 Feb. 29, 2024

Related U.S. Application Data

(63) Continuation of application No. 17/563,721, filed on Dec. 28, 2021, now Pat. No. 11,831,304, which is a continuation of application No. PCT/CN2019/093868, filed on Jun. 28, 2019.

(51) Int. Cl.
*H03K 17/16* (2006.01)
*H04B 1/40* (2015.01)
*H03F 3/45* (2006.01)

(52) U.S. Cl.
CPC .............. *H03K 17/16* (2013.01); *H04B 1/40* (2013.01); *H03F 3/45475* (2013.01)

(58) Field of Classification Search
CPC .... H03K 17/16; H03F 3/45475; G08C 23/04; H04N 21/42221; H04L 25/028; H04L 25/0292; H04L 25/0266; H04B 1/40; H04B 1/38
See application file for complete search history.

(56) References Cited

U.S. PATENT DOCUMENTS

| 5,657,346 A | 8/1997 | Lordi et al. |
| 6,667,650 B2 | 12/2003 | Gammie et al. |
| 10,191,504 B2 | 1/2019 | Shiine et al. |

(Continued)

FOREIGN PATENT DOCUMENTS

| CN | 1512583 A | 7/2004 |
| CN | 201886624 U | 6/2011 |

(Continued)

*Primary Examiner* — Jung Kim
(74) *Attorney, Agent, or Firm* — Conley Rose, P.C.

(57) ABSTRACT

A transceiver circuit includes a first interface and a second interface that are connected to an optical transceiver device, a receiver circuit, a transmitter circuit, and a compensation circuit. The receiver circuit includes a differential amplifier, where a first phase input terminal of the differential amplifier is coupled to the first interface, and a second phase input terminal of the differential amplifier is coupled to the second interface. The transmitter circuit includes a first transistor, where a terminal of the first transistor is coupled to the second phase input terminal, and another terminal of the first transistor is coupled to a ground terminal. The compensation circuit is configured to provide a leakage path for the first phase input terminal, or provide a compensation current for the second phase input terminal.

20 Claims, 8 Drawing Sheets

(56) References Cited

U.S. PATENT DOCUMENTS

| | | | |
|---|---|---|---|
| 2004/0124340 A1 | 7/2004 | Inoue et al. | |
| 2013/0063103 A1 | 3/2013 | Samid | |
| 2014/0145789 A1* | 5/2014 | Sugimoto | H03F 3/087 |
| | | | 330/252 |
| 2016/0246145 A1 | 8/2016 | Du et al. | |
| 2018/0217624 A1 | 8/2018 | Shiine et al. | |

FOREIGN PATENT DOCUMENTS

| | | |
|---|---|---|
| CN | 202421929 U | 9/2012 |
| CN | 108376013 A | 8/2018 |
| KR | 101513213 B1 | 4/2015 |

\* cited by examiner

TRANSCEIVER CIRCUIT, AND CHIP AND TERMINAL DEVICE THAT USE TRANSCEIVER CIRCUIT

CROSS-REFERENCE TO RELATED APPLICATIONS

This application is a continuation of U.S. patent application Ser. No. 17/563,721, filed on Dec. 28, 2021, now issued as U.S. Pat. No. 11,831,304, which is a continuation of International Patent Application No. PCT/CN2019/093868, filed on Jun. 28, 2019. All of the aforementioned patent applications are hereby incorporated by reference in their entireties.

TECHNICAL FIELD

This application relates to the field of chip technologies, and in particular, to a transceiver circuit, and a chip and a terminal device that use the transceiver circuit.

BACKGROUND

As there are increasingly more home appliances such as televisions and air conditioners in each household, these household appliances also correspond to various infrared remote controls. In addition, smartphones have become indispensable portable mobile apparatuses for family members. Based on this, to normalize remote control of home appliances in a household, a short-range communications chip in a smartphone integrates infrared transmitting and self-learning functions, so that the smartphone also becomes a remote control apparatus that integrates the transmitting and learning functions.

Generally, home appliances of a same manufacturer are configured with remote controls for remotely controlling the home appliances, and remote controls of home appliances of different manufacturers are incompatible. Therefore, if a smartphone is used as a remote control apparatus to remotely control home appliances of different manufacturers, the smartphone needs to learn infrared remote control information of different manufacturers. That is, the smartphone is used as a receiving apparatus to receive remote control information sent by another infrared remote control during working. Correspondingly, when the smartphone remotely controls a home appliance, the smartphone is also used as an infrared transmitting apparatus to send a remote control signal to the home appliance. An infrared transmitting function and a self-learning function of the smartphone works in a time division mode. Based on this, the industry proposes an infrared transmitting and receiving analog front end subject to time division multiplexing. A circuit corresponding to the infrared transmitting and receiving analog front end subject to time division multiplexing may be shown in FIG. 1. Resistors R1 and R2, a current source T, a differential amplifier P, a low-pass filter (LPF), and a comparator C constitute a receiver circuit, and a transmitter drive circuit and a transistor MN1 constitute a transmitter circuit. In an advanced process of a node of or below 28 nm and a high-temperature fast-fast (FF) corner, the transistor MN1 in FIG. 1 has a risk of electric leakage at a microampere ($\mu A$) level. When the transmitter circuit does not work but the receiver circuit works, the electric leakage causes inaccurate input of the amplifier P, affecting accuracy of output of the receiver circuit.

SUMMARY

Embodiments of this application provide a transceiver circuit, and a chip and a terminal device that use the transceiver circuit, to effectively reduce impact of electric leakage of a transistor on a receiver circuit in the transceiver circuit.

According to a first aspect, a transceiver circuit is provided, including a first interface and a second interface that are connected to an optical transceiver device, a receiver circuit, a transmitter circuit, and a compensation circuit. The receiver circuit includes a differential amplifier, where a first phase input terminal of the differential amplifier is coupled to the first interface, and where a second phase input terminal of the differential amplifier is coupled to the second interface. The transmitter circuit includes a first transistor, where a terminal of the first transistor is coupled to the second phase input terminal, and where another terminal of the first transistor is coupled to a ground terminal. The compensation circuit is configured to provide a leakage path for the first phase input terminal, or provide a compensation current for the second phase input terminal. Because the terminal of the first transistor is coupled to the second phase input terminal, and the other terminal of the first transistor is coupled to the ground terminal, when the receiver circuit or the transmitter circuit works, the second phase input terminal has a leakage current that flows to the ground terminal through the first transistor. Therefore, in this application, when the leakage path is provided for the first phase input terminal, or the compensation current is provided for the second phase input terminal, impact of the leakage current on the receiver circuit is reduced, to reduce impact of the leakage current on receiving sensitivity of the transceiver circuit.

In a possible design, the transmitter circuit further includes a transmitter drive circuit, and the transmitter drive circuit is configured to control turn-on or turn-off of the first transistor. That is, when a terminal device in which the transceiver circuit is located needs to send an infrared signal to an electric appliance or the like, the terminal device may drive, by using the transmitter drive circuit, the first transistor to be turned on, to trigger the optical transceiver device to emit infrared light.

In a possible design, when the compensation circuit is configured to provide the leakage path for the first phase input terminal, the compensation circuit includes a second transistor. A first terminal of the second transistor is coupled to the first phase input terminal, and a second terminal and a gate control terminal of the second transistor are coupled to a ground terminal. Herein, the first transistor and the second transistor may be n-channel metal-oxide-semiconductor (NMOS) transistors. Therefore, the first phase input terminal also has a leakage current that flows to the ground terminal through the second transistor, such that an offset voltage generated by the leakage current of the second transistor at the first phase input terminal can be used to reduce an offset voltage generated by the leakage current of the first transistor at the second phase input terminal, to reduce impact of the leakage current of the first transistor on the receiver circuit.

In a possible design, when the compensation circuit is configured to provide the leakage path for the first phase input terminal, the compensation circuit includes a second transistor. A first terminal of the second transistor is coupled to the first phase input terminal, a gate control terminal of the second transistor is coupled to the first interface, and a second terminal of the second transistor is coupled to a ground terminal. Herein, the first transistor and the second transistor may be p-channel metal-oxide-semiconductor (PMOS) transistors. A technical problem resolving principle of this possible design is similar to that of the foregoing possible design.

In a possible design, when the compensation circuit is configured to provide the leakage path for the first phase input terminal, the compensation circuit includes a second transistor, a third transistor, a fourth transistor, a fifth transistor, and a sixth transistor. A first terminal of the sixth transistor is coupled to the first phase input terminal, a second terminal of the sixth transistor is coupled to a ground terminal, and a gate control terminal of the sixth transistor is coupled to a gate control terminal of the fifth transistor. A gate control terminal of the fifth transistor is coupled to a first terminal of the fifth transistor, the first terminal of the fifth transistor is coupled to a first terminal of the fourth transistor, and a second terminal of the fifth transistor is coupled to a ground terminal. A second terminal of the fourth transistor is coupled to the first interface, and a gate control terminal of the fourth transistor is coupled to the gate control terminal of the third transistor. A first terminal of the third transistor is coupled to the first interface, a second terminal of the third transistor is coupled to a first terminal of the second transistor, and the second terminal of the third transistor is coupled to the gate control terminal of the third transistor. A second terminal of the second transistor and a gate control terminal of the second transistor are coupled to a ground terminal; or a gate control terminal of the second transistor is coupled to the first interface, and a second terminal of the second transistor is coupled to a ground terminal. Herein, the third transistor and the fourth transistor constitute a current mirror structure, and the fifth transistor and the sixth transistor also constitute a current mirror structure. Therefore, the first phase input terminal has a leakage current that flows to the ground terminal through the two current mirror structures and the second transistor, to cancel the leakage current that flows from the second phase input terminal to the first transistor.

In a possible design, when the compensation circuit is configured to provide the compensation current for the second phase input terminal, the compensation circuit includes a second transistor and a current mirror, where a terminal of the second transistor is coupled to a ground terminal, where a terminal of the current mirror is coupled to a terminal of the second transistor MN2, and where another terminal of the current mirror is coupled to the second phase input terminal. The second transistor is configured to provide a leakage current that flows to the ground terminal. The current mirror is configured to amplify the leakage current to obtain the compensation current, where the compensation current is injected into the second phase input terminal. In this way, when the first transistor is not turned on, the second transistor is also turned off. Therefore, both the two transistors generate leakage currents. When the compensation current is injected into the second phase input terminal, for the differential amplifier P, the second phase input terminal of the differential amplifier P has both the flowing-out leakage current and the injected leakage current, such that the leakage current that flows from the second phase input terminal of the differential amplifier through the first transistor can be canceled to a specific extent. Therefore, the compensation current that is injected into the second phase input terminal and that is provided in this embodiment of this application may be used to reduce impact of the electric leakage of the first transistor at the second phase input terminal on output of the differential amplifier.

In a possible design, when the compensation circuit is configured to provide the compensation current for the second phase input terminal, the compensation circuit includes a second transistor, a third transistor, and a fourth transistor. A first terminal and a gate control terminal of the second transistor are coupled to a ground terminal, and a second terminal of the second transistor is coupled to a first terminal of the third transistor. Alternatively, a first terminal of the second transistor is coupled to a ground terminal, a gate control terminal of the second transistor is coupled to the first interface, and a second terminal of the second transistor is coupled to a first terminal of the third transistor. A second terminal of the third transistor is coupled to the first interface, the first terminal of the third transistor is coupled to a gate control terminal of the third transistor, and the gate control terminal of the third transistor is coupled to a gate control terminal of the fourth transistor. A first terminal of the fourth transistor is coupled to the first interface, and a second terminal of the fourth transistor is coupled to the second phase input terminal. The third transistor and the fourth transistor may constitute a current mirror structure. Therefore, when a branch from the second phase input terminal to the first transistor has a leakage current, the fourth transistor has a leakage current that flows to the second phase input terminal, and directions of the two leakage currents are opposite, such that impact of the leakage current from the second phase input terminal to the first transistor on the receiver circuit can be reduced.

According to a second aspect, a transceiver circuit is provided, including a first interface and a second interface that are connected to an optical transceiver device, a receiver circuit, a transmitter circuit, and a compensation circuit. The receiver circuit includes a differential amplifier, where a first phase input terminal of the differential amplifier is coupled to the first interface, and where a second phase input terminal of the differential amplifier is coupled to the second interface. The transmitter circuit includes a first transistor, where a terminal of the first transistor is coupled to the second phase input terminal, and where another terminal of the transistor is coupled to a ground terminal. The compensation circuit is configured to reduce impact of a non-ideal characteristic of the first transistor on the differential amplifier.

In a possible design, the transceiver circuit is the transceiver circuit according to the first aspect.

According to a third aspect, a chip is provided. The chip includes the transceiver circuit according to the first aspect or the second aspect.

According to a fourth aspect, a terminal device is provided. The terminal device includes the transceiver circuit according to the first aspect or the second aspect, or the terminal device includes the chip according to the third aspect.

According to a fifth aspect, a transceiver circuit is further provided, including a first interface and a second interface that are connected to an optical transceiver device, a receiver circuit, a transmitter circuit, and a compensation circuit. The receiver circuit includes a differential amplifier, where a first phase input terminal of the differential amplifier is coupled to the first interface, and where a second phase input terminal of the differential amplifier is coupled to the second interface. The transmitter circuit includes a first transistor, where a terminal of the first transistor is coupled to the second phase input terminal, and where another terminal of the first transistor is coupled to a ground terminal. The compensation circuit includes a second transistor, where a first terminal of the second transistor is coupled to the first phase input terminal, where a second terminal of the second transistor is coupled to a ground terminal, and where a gate of the second transistor is coupled to the ground terminal or the first interface.

According to a sixth aspect, a transceiver circuit is further provided, including a first interface and a second interface that are connected to an optical transceiver device, a receiver circuit, a transmitter circuit, and a compensation circuit. The receiver circuit includes a differential amplifier, where a first phase input terminal of the differential amplifier is coupled to the first interface, and where a second phase input terminal of the differential amplifier is coupled to the second interface. The transmitter circuit includes a first transistor, where a terminal of the first transistor is coupled to the second phase input terminal, and where another terminal of the first transistor is coupled to a ground terminal. The compensation circuit includes a second transistor, a third transistor, a fourth transistor, a fifth transistor, and a sixth transistor. A first terminal of the sixth transistor is coupled to the first phase input terminal, a second terminal of the sixth transistor is coupled to a ground terminal, and a gate control terminal of the sixth transistor is coupled to a gate control terminal of the fifth transistor. A gate control terminal of the fifth transistor is coupled to a first terminal of the fifth transistor, the first terminal of the fifth transistor is coupled to a first terminal of the fourth transistor, and a second terminal of the fifth transistor is coupled to a ground terminal. A second terminal of the fourth transistor is coupled to the first interface, and a gate control terminal of the fourth transistor is coupled to the gate control terminal of the third transistor. A first terminal of the third transistor is coupled to the first interface, a second terminal of the third transistor is coupled to a first terminal of the second transistor, and the second terminal of the third transistor is coupled to the gate control terminal of the third transistor. A second terminal of the second transistor and a gate control terminal of the second transistor are coupled to a ground terminal; or a gate control terminal of the second transistor is coupled to the first interface, and a second terminal of the second transistor is coupled to a ground terminal.

According to a seventh aspect, a transceiver circuit is further provided, including a first interface and a second interface that are connected to an optical transceiver device, a receiver circuit, a transmitter circuit, and a compensation circuit. The receiver circuit includes a differential amplifier, where a first phase input terminal of the differential amplifier is coupled to the first interface, and where a second phase input terminal of the differential amplifier is coupled to the second interface. The transmitter circuit includes a first transistor, where a terminal of the first transistor is coupled to the second phase input terminal, and where another terminal of the first transistor is coupled to a ground terminal. The compensation circuit includes a second transistor and a current mirror, where a terminal of the second transistor is coupled to a ground terminal, where a terminal of the current mirror is coupled to a terminal of the second transistor MN2, and where another terminal of the current mirror is coupled to the second phase input terminal. The second transistor is configured to provide a leakage current that flows to the ground terminal. The current mirror is configured to amplify the leakage current to obtain a compensation current, where the compensation current is injected into the second phase input terminal.

Therefore, in the transceiver circuit provided in this application, to resolve a problem that the second phase input terminal of the differential amplifier in the receiver circuit has the leakage current that flows to the ground terminal through the first transistor, in this application, when the leakage circuit may be provided for the first phase input terminal of the differential amplifier, or the compensation current may be provided for the second phase input terminal, impact of the leakage current on the receiver circuit can be reduced, to reduce impact of the electric leakage on receiving sensitivity of the transceiver circuit.

DESCRIPTION OF EMBODIMENTS

The embodiments of this application may be used to: when a mobile terminal is used as a remote control, compensate for electric leakage of a transistor in an infrared analog front end in the mobile terminal, to effectively reduce impact of the electric leakage on the infrared receiving analog front end.

This application provides a transceiver circuit. The transceiver circuit may be integrated into a communications chip in a terminal device. Usually, the transceiver circuit may be integrated into a short-range communications chip. The terminal device may be a device such as a mobile phone or a tablet computer.

A transceiver circuit used for a wireless personal area network (such as Bluetooth), a wireless local area network, or the like may be integrated into the short-range communications chip. The transceiver circuit may be connected to an optical transceiver device outside the short-range communications chip. If the electronic device performs remote control by using infrared light, the optical transceiver device may be an infrared light-emitting diode (LED). The transceiver circuit learns infrared remote control information by using the infrared LED, and remotely controls an electric appliance based on the learned remote control information.

Figure 1:
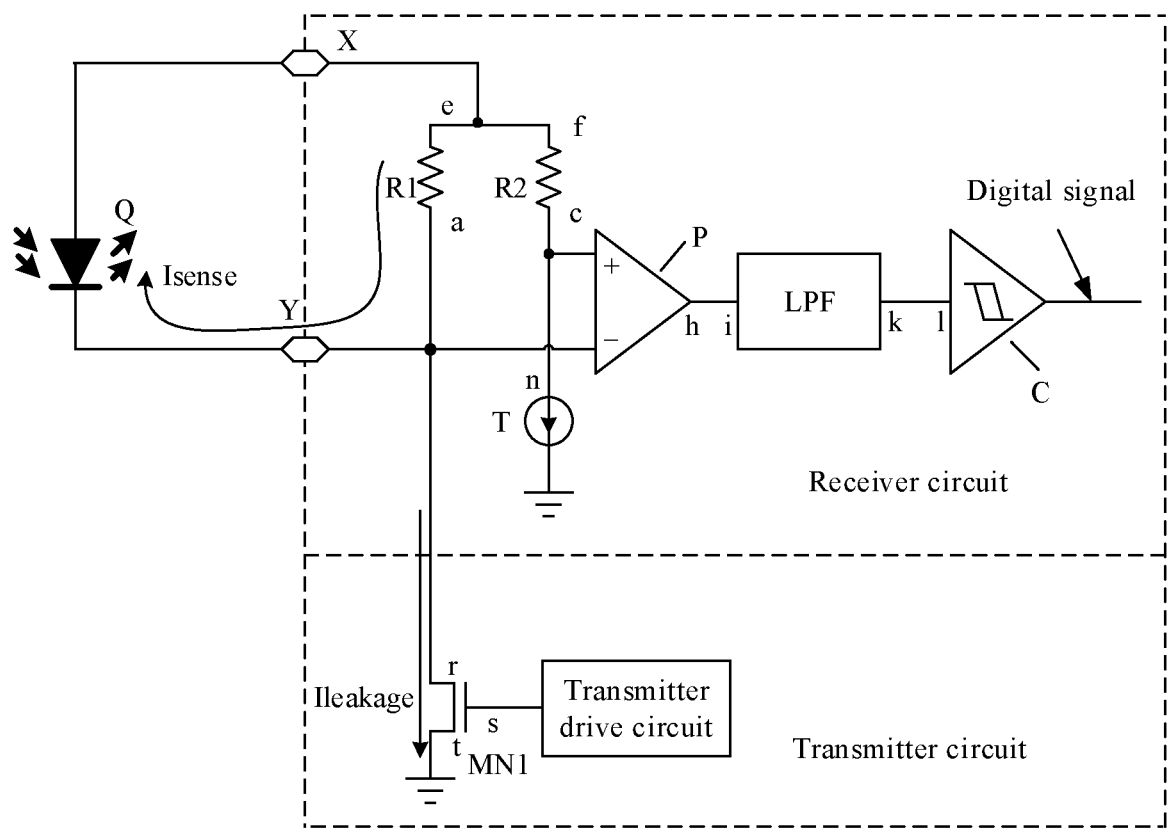
FIG. 1 is a schematic diagram in which a smartphone is used as a remote control apparatus.

A structure of the transceiver circuit is shown in FIG. 1. The transceiver circuit includes a first interface X and a second interface Y that are connected to the optical transceiver device, a receiver circuit, and a transmitter circuit. The receiver circuit includes a resistor R1, a resistor R2, a differential amplifier P, an LPF, a comparator C, a current source T, and the like. The transmitter circuit includes a transistor MN1 and a transmitter drive circuit, and the transistor may be an NMOS or a PMOS transistor. Refer to FIG. 1. A terminal e of the resistor R1 is coupled to the first interface X, and another terminal a of the resistor R1 is coupled to a second phase input terminal (−) of the differential amplifier P; a terminal f of the resistor R2 is coupled to the first interface X, and another terminal c of the resistor R2 is coupled to a first phase input terminal (+) of the differential amplifier P; an output terminal h of the differential amplifier P is coupled to an input terminal i of the LPF; an output terminal k of the LPF is coupled to an input terminal l of the comparator C; a terminal n of the current source T is coupled to the first phase input terminal of the differential amplifier P, and another terminal of the current source T is grounded; and a first terminal r of MN1 is coupled to the second phase input terminal of the differential amplifier P, a gate control terminal s of MN1 is coupled to the transmitter drive circuit, and a second terminal t of MN1 is grounded. It should be noted that the first interface X may be a voltage interface. In an actual implementation, the first interface X is not necessarily physically connected to a terminal of the optical transceiver device, but only needs to be connected to a same analog voltage device drain (AVDD) port with a terminal of the optical transceiver device.

The transceiver circuit in this embodiment of this application is disposed in an electronic device such as a terminal device. The receiver circuit is configured to receive a remote control signal, such as infrared light, generated by a remote control device other than the terminal device when the remote control device remotely controls an electric appliance. The transmitter circuit is configured to send a remote control signal to the electric appliance by using the optical transceiver device. The receiver circuit may receive the remote control signal when a user uses a remote control of the electric appliance to remotely control the electric appliance. For example, if a distance between the optical transceiver device of the terminal device and an optical transceiver device of another remote control falls within an identifiable distance range, when the user uses the remote control to remotely control the electric appliance, the optical transceiver device of the terminal device may sense infrared light of the remote control. In this case, a current is generated in the receiver circuit, and a direction of the current may be shown as Isense in FIG. 1. When the remote control performs different remote control operations, the current Isense generated in the infrared receiver circuit has different information such as frequencies and pulse widths, and different voltages are generated at the inverting input terminal of the differential amplifier due to the current Isense. In this case, a voltage difference between a voltage of the current source T at the non-inverting input terminal and a voltage generated at the inverting input terminal due to the current Isense is amplified by a specific gain by using the differential amplifier P, an amplified voltage signal is filtered by using the LPF, to obtain a low-frequency voltage signal, and analog-to-digital conversion is performed on the filtered voltage signal by using the comparator C, to convert the voltage signal into a digital signal. The digital signal is infrared remote control information learned by the receiver circuit. The transmitter drive circuit in the transmitter circuit may trigger, based on the infrared remote control information learned by the receiver circuit, a branch of the optical transceiver device to generate different Isense currents to remotely control the electric appliance. A remote control process may be as follows: When the terminal device remotely controls the electric appliance, the transmitter drive circuit in the transmitter circuit outputs a control signal to a gate of the transistor MN1, where the control signal is used to drive the transistor to convert a digital signal into an analog signal, that is, into a voltage signal, to generate a current Isense corresponding to the voltage signal in a circuit of the optical transceiver device. When an optical transceiver device of the electric appliance senses infrared light of the optical transceiver device of the terminal device, it means that a remote control operation indication is received.

Refer to FIG. 1. The transistor MN1 in the transmitter circuit is controlled by the transmitter drive circuit to be turned on or turned off; or the transistor MN1 is turned on when the transmitter circuit works, or the transistor MN1 is turned off when the receiver circuit works, to enable the inverting input terminal of the amplifier P to be coupled to a ground terminal or disconnected from the ground terminal. However, the transistor still causes electric leakage when being turned off, and higher process precision indicates more electric leakage. Therefore, when the receiver circuit receives a signal by using the optical transceiver device, the transistor MN1 that originally should be turned off causes electric leakage, and consequently an error is caused in an input signal of the amplifier P, affecting output of the receiver circuit.

Therefore, to reduce impact of a leakage current, an embodiment of this application provides a transceiver circuit, having the following similar parts to that in FIG. 1: The transceiver circuit includes a first interface X (a power supply pin) and a second interface Y that are connected to an optical transceiver device, a receiver circuit, and a transmitter circuit. The receiver circuit includes a differential amplifier P, a first phase input terminal (for example, "+" in FIG. 1) of the differential amplifier P is coupled to the first interface X, and a second phase input terminal (for example, "−" in FIG. 1) of the differential amplifier P is coupled to the second interface Y. The transmitter circuit includes a first transistor (for example, MN1 in FIG. 1), a terminal of the first transistor is coupled to the second phase input terminal, and another terminal of the first transistor is coupled to a ground terminal. The transceiver circuit provided in this application has the following different parts from that in FIG. 1: The transceiver circuit in this application further includes a compensation circuit, and the compensation circuit is configured to reduce impact of a non-ideal characteristic of the first transistor on the differential amplifier. The impact may be understood as follows: Because the terminal of the first transistor is coupled to the second phase input terminal, and the other terminal of the first transistor is coupled to the ground terminal, the first transistor has a leakage current that flows to the ground terminal. Refer to FIG. 1. The leakage current affects a voltage of the inverting input terminal of the differential amplifier P in the receiver circuit, affecting accuracy of the receiver circuit. Therefore, the compensation circuit in this application is configured to reduce impact of the leakage current on the receiver circuit.

Based on the provided compensation circuit, an embodiment of this application provides a transceiver circuit. The transceiver circuit includes the compensation circuit, and the compensation circuit is configured to provide a leakage path for a first phase input terminal of a differential amplifier, or provide a compensation current to a second phase input terminal.

The providing a leakage path for a first phase input terminal of a differential amplifier may be understood as providing, in a current path connected to the first phase input terminal, a leakage current in a same direction as a leakage current of the second phase input terminal. In this way, both the first phase input terminal and the second phase input terminal of the differential amplifier have leakage currents that flow to ground terminals, and an offset voltage generated by the leakage current of the leakage path at the first phase input terminal can be used to reduce an offset voltage generated by the leakage current of the first transistor at the second phase input terminal, to reduce impact of a non-ideal characteristic of the first transistor on the differential amplifier.

The providing a compensation current to a second phase input terminal may be understood as injecting a current into the second phase input terminal. Because the second phase input terminal has a leakage current that flows to a ground terminal of a first transistor, in this application, the current is injected into the second phase input terminal, such that impact of an offset voltage generated by the leakage current of the first transistor at the second phase input terminal can be reduced, to reduce impact of a non-ideal characteristic of the first transistor on the differential amplifier.

The following first further describes the fact that the compensation circuit is configured to provide a leakage path for a first phase input terminal of a differential amplifier.

Figure 2:
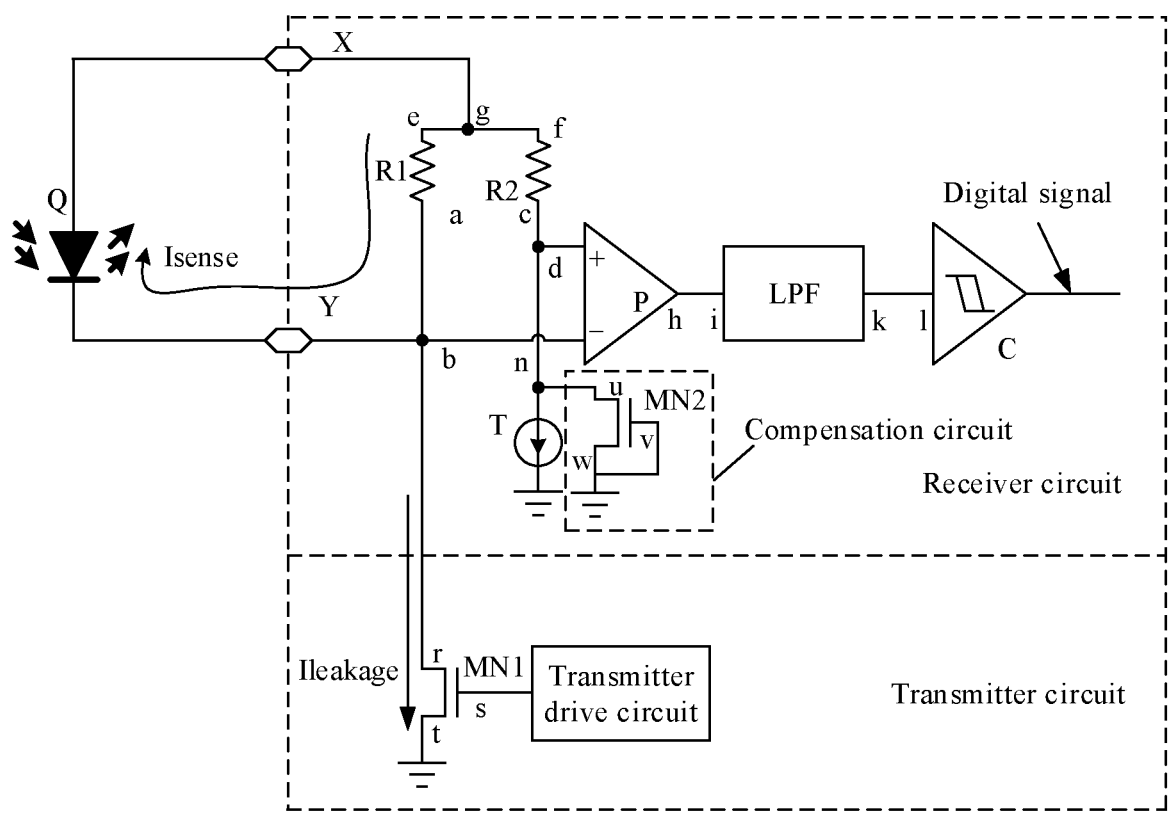
FIG. 2 is a schematic diagram of a circuit corresponding to an infrared transmitting and receiving analog front end.

Refer to FIG. 2. A transceiver circuit provided in this application includes a first interface X and a second interface Y that are connected to an optical transceiver device Q, a receiver circuit, a transmitter circuit, and a compensation circuit.

The receiver circuit includes a differential amplifier P, where a first phase input terminal of the differential amplifier P is coupled to the first interface X, and where a second phase input terminal of the differential amplifier P is coupled to the second interface Y.

The transmitter circuit includes a first transistor MN1, where a terminal r of the first transistor MN1 is coupled to the second phase input terminal, and where another terminal t of the first transistor MN1 is coupled to a ground terminal. It should be noted that, in FIG. 2, the first phase input terminal coupled to a current source T is a non-inverting input terminal, and the second phase input terminal coupled to the terminal r of MN1 is an inverting input terminal. It may be understood that the second phase input terminal coupled to the terminal r of MN1 may alternatively be a non-inverting input terminal. In this case, the first phase input terminal coupled to the current source T is an inverting input terminal.

The compensation circuit includes a second transistor MN2, a first terminal u of the second transistor MN2 is coupled to the first phase input terminal, and a gate control terminal v and a second terminal w of the second transistor MN2 are coupled to a ground. In this case, the second transistor MN2 may be an NMOS transistor, that is, the second transistor MN2 is always in a turn-off state. In this case, in this application, the second transistor MN2 is also introduced at the first phase input terminal of the differential amplifier P. When the first transistor MN1 is not turned on, the second transistor MN2 is also turned off. Therefore, both the two transistors generate leakage currents. For the differential amplifier P, electric leakage occurs at both the first phase input terminal and the second phase input terminal of the differential amplifier P. This reduces impact of electric leakage of the first transistor MN1 at the second phase input terminal on output of the differential amplifier P. If a size of the second transistor MN2 is the same as a size of the first transistor MN1, that is, the transistors has a same width and length (W and L), when the first transistor MN1 generates a leakage current Ileakage, the second transistor MN2 also generates a leakage current Ileakage that has a same current value and that flows to the ground. In this way, an offset voltage generated at the second phase input terminal of the differential amplifier P due to the leakage current of the first transistor MN1 may be almost completely canceled by an offset voltage generated at the first phase input terminal of the differential amplifier P due to the leakage current of the second transistor MN2.

In addition, the transmitter circuit further includes a transmitter drive circuit, and the transmitter drive circuit is configured to control turn-on or turn-off of the first transistor MN1. The transmitter drive circuit turns off the first transistor MN1 when the transmitter circuit does not work, or when the receiver circuit works.

An idea of the compensation circuit in this embodiment of this application is that the gate control terminal of the second transistor MN2 is grounded to enable the second transistor MN2 to be always in a turn-off state. In actual use, alternatively, the gate control terminal of the second transistor MN2 may be coupled to a signal source similar to the transmitter drive circuit in the transmitter circuit. Provided that the second transistor MN2 is also turned off when the first transistor MN1 is turned off, electric leakage of the first transistor MN1 can be compensated for by using the second transistor MN2.

In this embodiment of this application, the receiver circuit further includes resistors R1 and R2, and further includes the differential amplifier P, a low-pass filter (LPF), and a comparator C.

For a connection relationship of the circuit, refer to FIG. 2: a first terminal a of the first resistor R1 is coupled to the terminal r of the first transistor MN1, where a coupling node is shown as b; and where a second terminal e of the first resistor R1 is coupled to the first interface X; a first terminal c of the second resistor R2 is coupled to an input terminal n of the current source T, where a coupling node d is coupled to the first phase input terminal (+) of the differential amplifier P; and a second terminal f of the second resistor R2 is coupled to the first interface X, and the second terminal f is coupled to the second terminal e of the first resistor R1, where a coupling node is g; an output terminal of the current source T is coupled to a ground terminal; a gate control terminal s of the first transistor MN1 is coupled to the transmitter drive circuit; and an output terminal h of the differential amplifier P is coupled to an input terminal i of the LPF, and an output terminal k of the LPF is coupled to an input terminal l of the comparator C.

Due to existence of the two resistors R1 and R2, the offset voltage generated by the first transistor MN1 at the inverting input terminal of the amplifier P can be expressed as R1×Ileakage, the offset voltage generated by the second transistor MN2 at the non-inverting input terminal of the amplifier P may be expressed as R2×Ileakage. When the resistor R1 and the resistor R2 have a same resistance value, the offset voltage generated at the second phase input terminal of the differential amplifier P due to the leakage current of the first transistor MN1 may be canceled by the offset voltage generated at the first phase input terminal of the differential amplifier P due to the leakage current of the second transistor MN2.

Therefore, in this application, to cancel the offset voltage generated by the first transistor MN1 at the inverting input terminal of the differential amplifier P, the compensation circuit, that is, the second transistor MN2, is additionally introduced, and a layout area of the transceiver circuit is increased by a device area of the second transistor MN2 compared with that in FIG. 1. Generally, if the first transistor MN1 and the second transistor MN2 have a same size, electric leakage of the first transistor MN1 can be better compensated for. The introduction of the second transistor MN2 seems to increase the layout area. However, in the conventional technology, to resolve the electric leakage problem of the first transistor MN1, usually, a size of the first transistor MN1 is increased in a same proportion. A final result is usually that the size of the first transistor MN1 needs to be increased to four times the original size. Compared with the conventional technology, the transceiver circuit provided in this application further has a smaller layout area.

It may be understood that, in FIG. 2, the first transistor MN1 and the second transistor MN2 are NMOS transistors. Certainly, the first transistor MN1 and the second transistor MN2 may alternatively be PMOS transistors. In this case, a circuit diagram of a transceiver circuit in which a compensation circuit is added in this application may be shown in FIG. 3. A first transistor is shown as MPP1, a second transistor is shown as MPP2, a first terminal u of the second transistor MPP2 is coupled to a first phase input terminal, a gate control terminal v of the second transistor MPP2 is coupled to a first interface X, and a second terminal w of the second transistor MPP2 is coupled to a ground terminal.

For that the compensation circuit is configured to provide a leakage path for a first phase input terminal of a differential amplifier, an embodiment of this application further provides a transceiver circuit, to cancel an offset voltage generated by a first transistor MN1 at a second phase input terminal of a differential amplifier P. Refer to FIG. 4. Similar to those in FIG. 2 and FIG. 3, the transceiver circuit provided in this embodiment also includes a first interface X and a second interface Y that are connected to an optical transceiver device Q, a receiver circuit, a transmitter circuit, and a compensation circuit. A difference is that the compensation circuit provided in FIG. 4 has a different circuit design from the compensation circuits provided in FIG. 2 and FIG. 3.

Refer to FIG. 4. The compensation circuit includes a second transistor MN2, a third transistor MP1, a fourth transistor MP2, a fifth transistor MN3, and a sixth transistor MN4.

A first terminal j of the sixth transistor MN4 is coupled to a first phase input terminal, a second terminal m of the sixth transistor MN4 is coupled to a ground terminal, and a gate control terminal o of the sixth transistor MN4 is coupled to a gate control terminal q of the fifth transistor MN3.

The gate control terminal q of the fifth transistor MN3 is coupled to a first terminal x of the fifth transistor MN3, the first terminal x of the fifth transistor MN3 is coupled to a first terminal p of the fourth transistor MP2, and a second terminal y of the fifth transistor MN3 is coupled to a ground terminal.

A second terminal z of the fourth transistor MP2 is coupled to the first interface X, and a gate control terminal A of the fourth transistor MP2 is coupled to a gate control terminal B of the third transistor MP1.

A first terminal D of the third transistor MP1 is coupled to the first interface X, a second terminal E of the third transistor MP1 is coupled to a first terminal u of the second transistor MN2, and the gate control terminal B of the third transistor MP1 is coupled to the second terminal E of the third transistor MP1.

A gate control terminal v of the second transistor MN2 and a second terminal w of the second transistor MN2 are coupled to a ground. In this case, the second transistor MN2 may be an NMOS transistor.

It may be learned that the gate control terminal of the fourth transistor MP2 is coupled to the gate control terminal of the third transistor MP1 to constitute a first current mirror structure, and the gate control terminal of the sixth transistor MN4 is coupled to the gate control terminal of the fifth transistor MN3 to constitute a second current mirror structure.

For circuit connection descriptions of the receiver circuit and the transmitter circuit in FIG. 4, refer to the descriptions in FIG. 2. Details are not described herein again.

Based on the circuit connection relationship, when the receiver circuit in the transceiver circuit works, the first transistor MN1 is not turned on and has a leakage current Ileakage. Therefore, an offset voltage is generated at the second phase input terminal of the differential amplifier P. In this embodiment of this application, because the first terminal D of the third transistor MP1 is coupled to the power supply pin X, and the second terminal w and the gate control terminal v of the second transistor MN2 are coupled to the ground, the second transistor MN2 is also turned off. Therefore, both the first transistor MN1 and the second transistor MN2 generate leakage currents. When the second transistor MN2 generates a leakage current, the third transistor MP1 on a same branch as the second transistor MN2 also has a leakage current, and the leakage current also flows through the sixth transistor MN4 under the action of the first current mirror and the second current mirror. Therefore, an offset voltage is generated at the first phase input terminal of the differential amplifier P. In this case, for the differential amplifier P, electric leakage occurs at both the first phase input terminal and the second phase input terminal of the differential amplifier P, such that the offset voltage at the first phase input terminal of the differential amplifier P can be used to reduce impact of the offset voltage of the first transistor MN1 at the second phase input terminal on output of the differential amplifier P.

For example, as shown in FIG. 4, a size ratio of the second transistor MN2 to the first transistor MN1 is 1:K, and K is a positive number greater than 1. In this case, if the first transistor MN1 has a leakage current Ileakage, the second transistor MN2 has a leakage current that has a value of Ileakage/K and that flows to the ground, and the third transistor MP1 also has a leakage current that has a value of Ileakage/K and that flows to the ground. If a size ratio of the third transistor MP1 to the fourth transistor is 1:K, that is, the second current mirror that includes the third transistor MP1 and the fourth transistor MP2 amplifies a current by 1:K, the fourth transistor MP2 has a leakage current that has a value of Ileakage, and the fifth transistor MN3 also has a leakage current that has a value of Ileakage. If a size ratio of the sixth transistor MN4 to the fifth transistor MN3 is 1:1, that is, the first current mirror that includes the sixth transistor MN4 and the fifth transistor MN3 is a 1:1 current mirror, the sixth transistor MN4 has a leakage current that has a value of Ileakage. Because the terminal j of the sixth transistor MN4 is connected to the first phase input terminal of the differential amplifier P, electric leakage occurs at both the first phase input terminal and the second phase input terminal of the differential amplifier P, and an offset voltage of the sixth transistor MN4 at the first phase input terminal of the differential amplifier P is R2×Ileakage. Because an offset voltage of the first transistor MN1 at the second phase input terminal of the amplifier P is R1×Ileakage, when R1 and R2 are equal in resistance value, the offset voltage generated due to the electric leakage of the sixth transistor MN4 at the first phase input terminal of the differential amplifier P can cancel the offset voltage generated due to the electric leakage of the first transistor MN1 at the second phase input terminal of the differential amplifier P. This reduces impact of the eclectic leakage of the first transistor MN1 at the second phase input terminal on output of the differential amplifier P.

Figure 3:
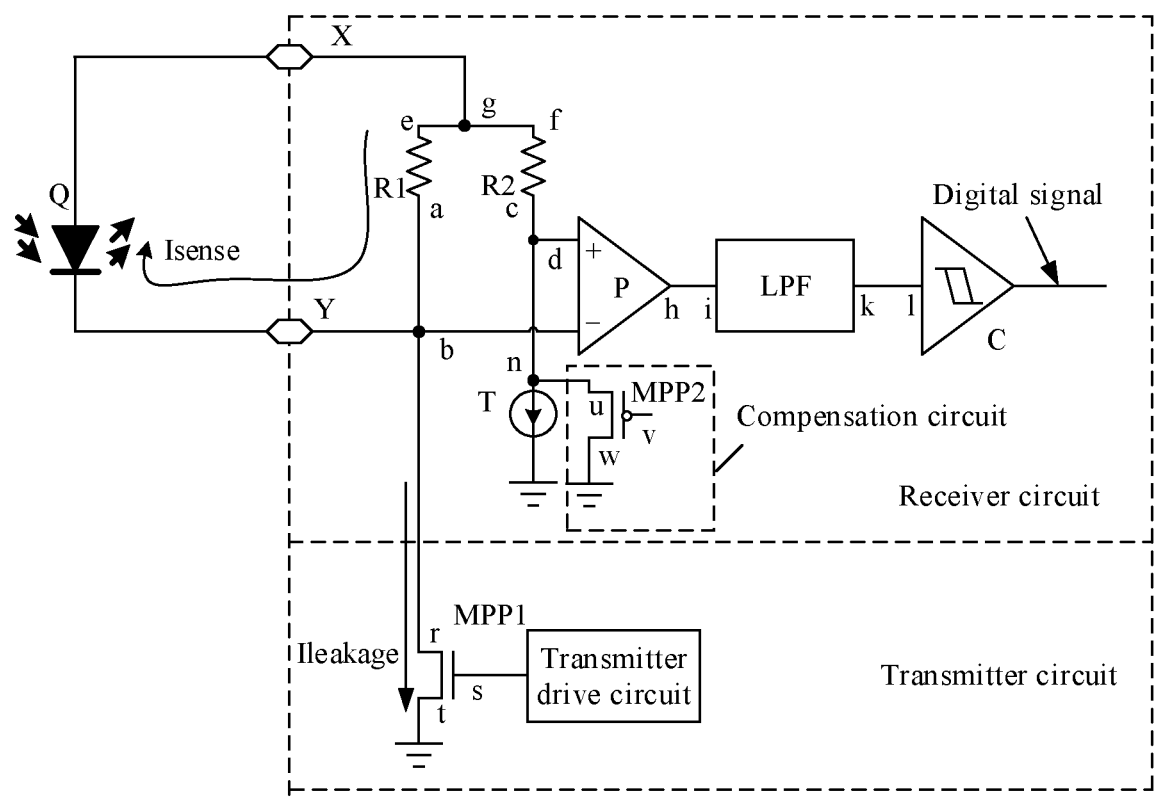
FIG. 3 is a schematic diagram of a transceiver circuit according to an embodiment of this application.
Figure 4:
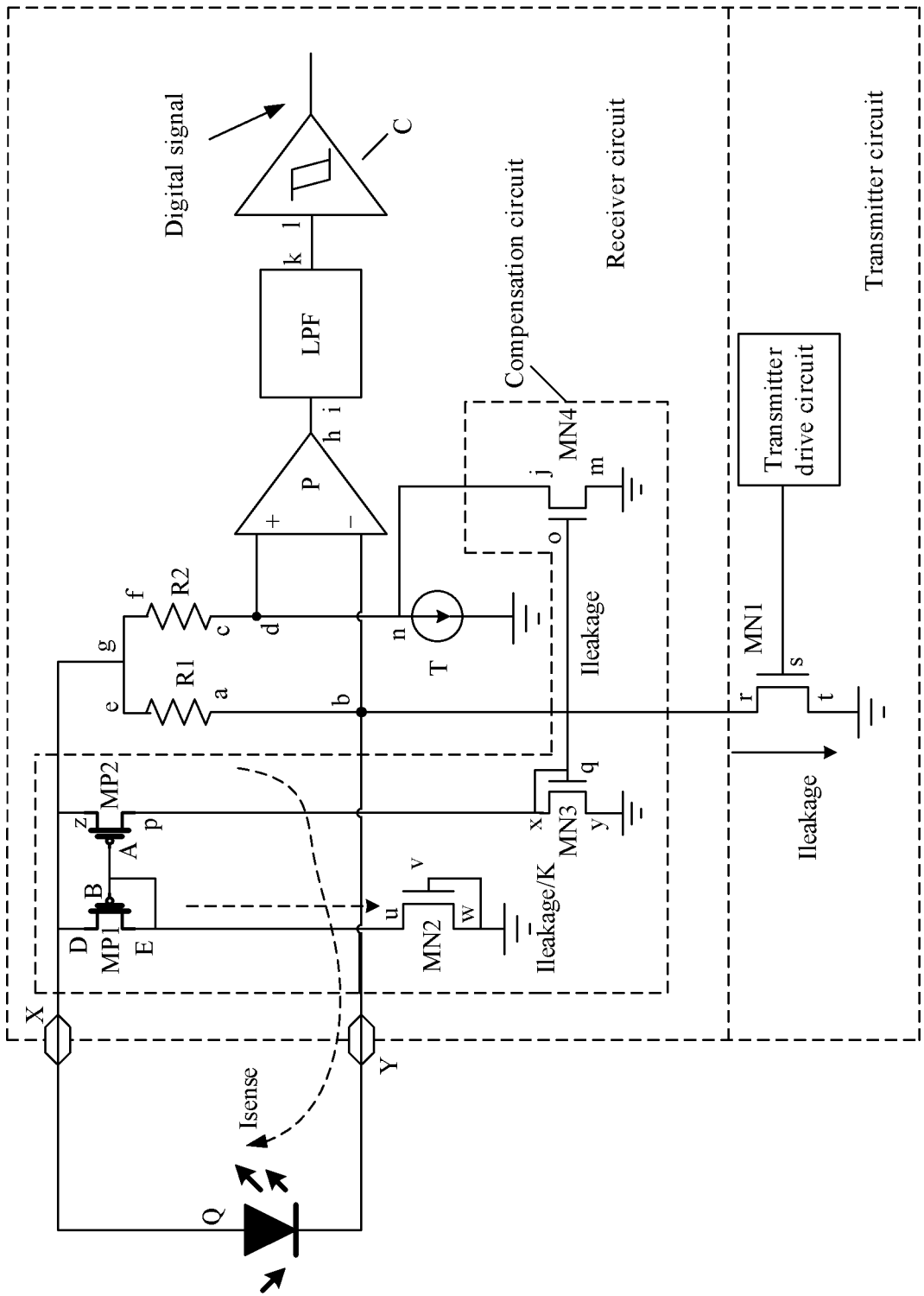
FIG. 4 is a schematic diagram of a transceiver circuit according to an embodiment of this application.

It may be learned that functions of the sixth transistor MN4, the fifth transistor MN3, the third transistor MP1, the fourth transistor MP2, and the second transistor MN2 in the circuit structure corresponding to FIG. 4 are equivalent to a function of the second transistor MN2 in FIG. 2 or the second transistor MPP2 in FIG. 3. Taking FIG. 2 as an example, in the circuit structure corresponding to FIG. 2, the layout area of the transceiver circuit is equivalent to being increased by one time an area of the first transistor MN1. In the circuit corresponding to FIG. 4, a layout area of the second transistor MN2 is 1/K of a layout area of the first transistor MN1, and the sixth transistor MN4, the fifth transistor MN3, the third transistor MP1, and the fourth transistor MP2 each may be a transistor having a much smaller area than the first transistor MN1. In this case, in the circuit corresponding to FIG. 4, when K=3, a layout area sum of the sixth transistor MN4, the fifth transistor MN3, the third transistor MP1, the fourth transistor MP2, and the second transistor MN2 is approximately ⅓ of the layout area of the first transistor MN1. In this case, compared with the circuit corresponding to FIG. 2, in the circuit corresponding to FIG. 4, a layout area of the transceiver circuit is further reduced.

In FIG. 4, the first transistor MN1, the sixth transistor MN4, the fifth transistor MN3, and the second transistor MN2 may be NMOS transistors, and the fourth transistor MP2 and the third transistor MP1 may be PMOS transistors.

Figure 5:
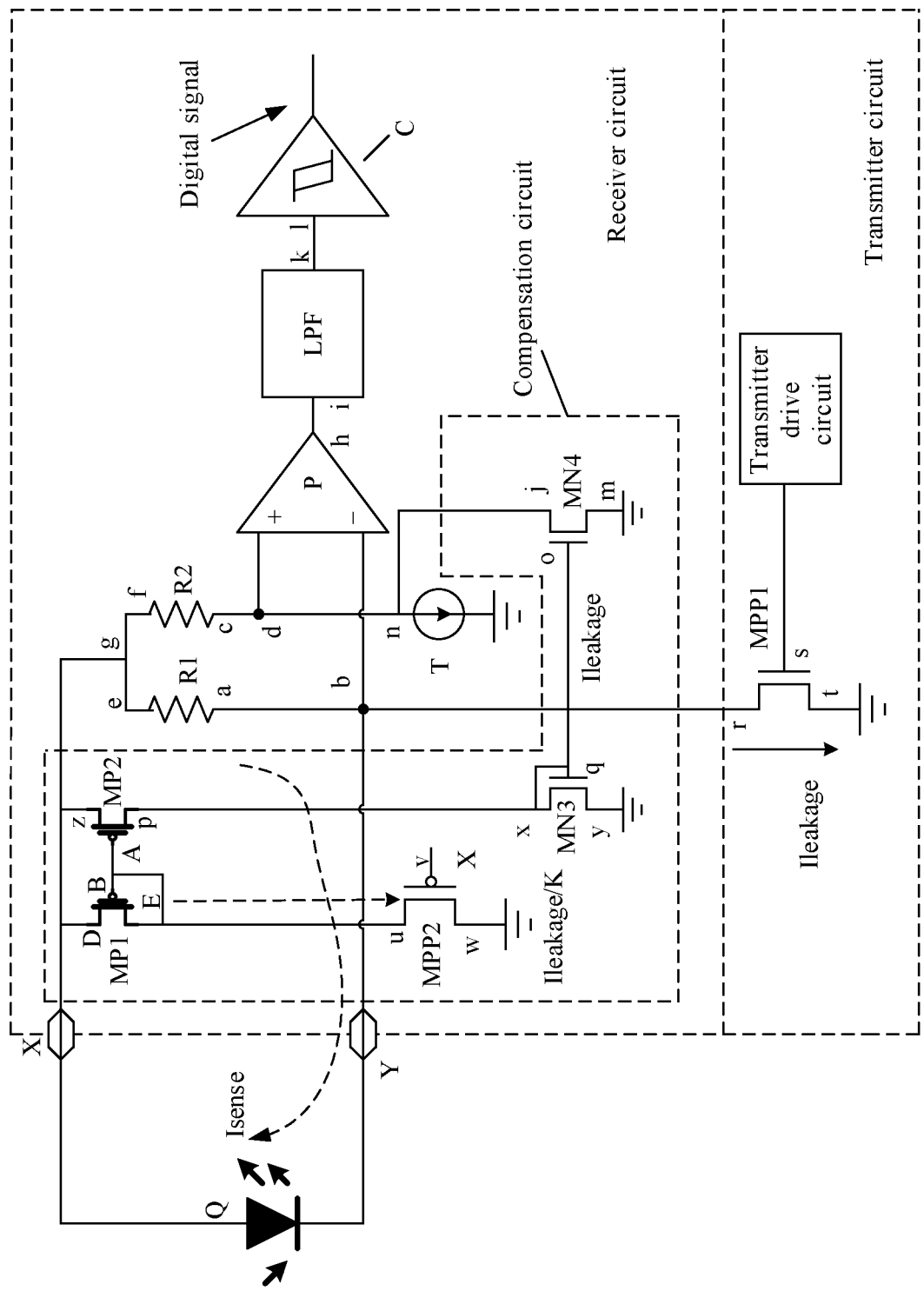
FIG. 5 is a schematic diagram of a transceiver circuit according to an embodiment of this application.

Alternatively, as shown in FIG. 5, the first transistor MN1 that has the leakage current in the circuit corresponding to FIG. 4 may be replaced with a PMOS transistor, for example, replaced with MPP1 in FIG. 5, denoted as a first transistor MPP1. Correspondingly, the second transistor MN2 that has the leakage current may also be replaced with a PMOS transistor, for example, MPP2 in FIG. 5, denoted as a second transistor MPP2. In this case, a gate control terminal v of the second transistor MPP2 is coupled to a first interface X, and a second terminal w of the second transistor MPP2 is coupled to a ground terminal.

Figure 6:
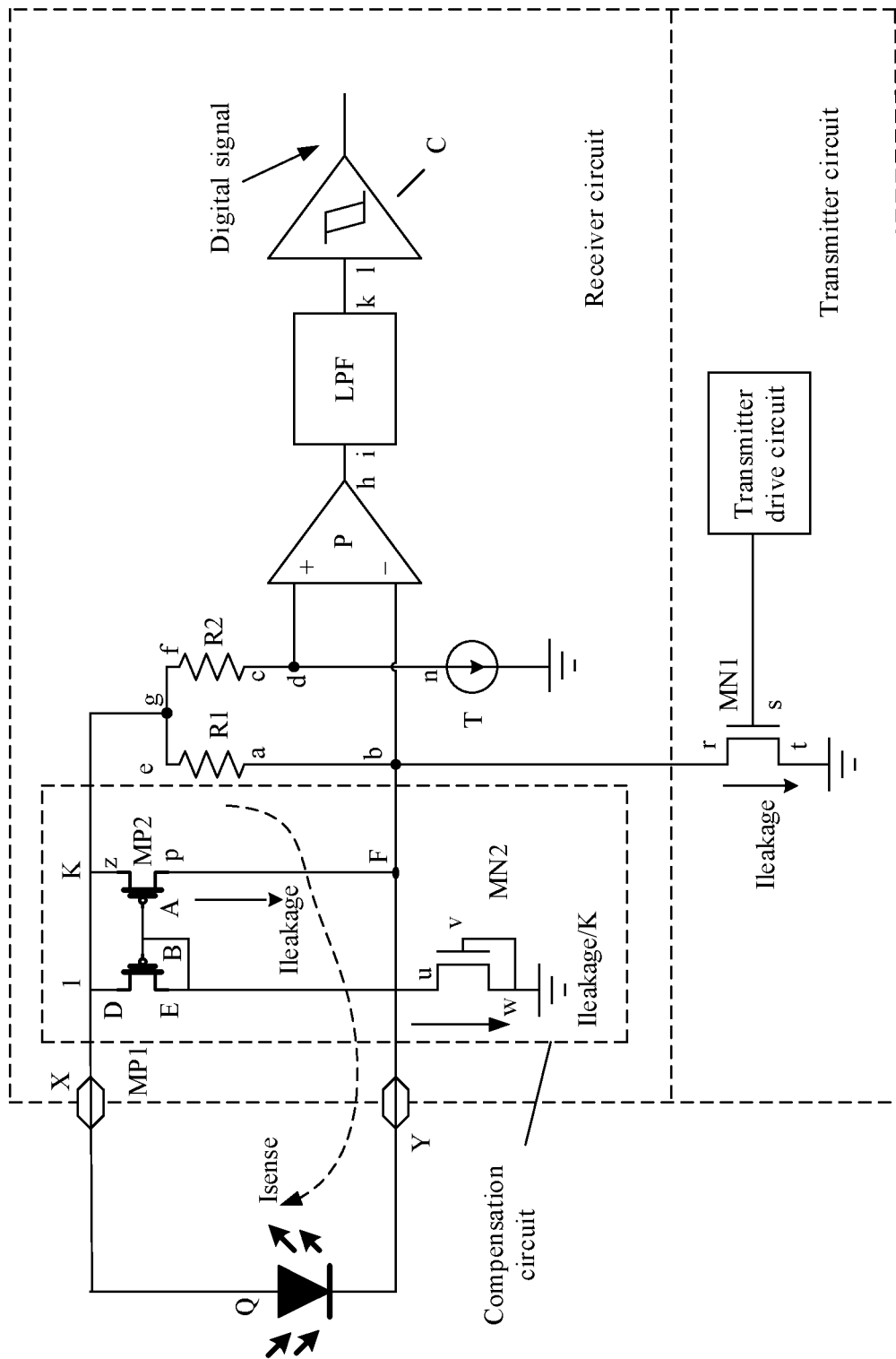
FIG. 6 is a schematic diagram of a transceiver circuit according to an embodiment of this application.

When the compensation circuit provided in this application is configured to provide the compensation current to the second phase input terminal of the differential amplifier P, as shown in FIG. 6, a transceiver circuit provided in this application also includes a first interface X and a second interface Y that are connected to an optical transceiver device Q, a receiver circuit, a transmitter circuit, and a compensation circuit. A difference is that the compensation circuit provided in FIG. 6 has a different circuit design from the compensation circuits provided in FIG. 2, FIG. 3, FIG. 4, and FIG. 5.

In this embodiment of this application, when the compensation circuit is configured to provide a compensation current for a second phase input terminal, as shown in FIG. 6, the compensation circuit includes a second transistor MN2, a third transistor MP1, and a fourth transistor MP2.

A first terminal w and a gate control terminal v of the second transistor MN2 are coupled to a ground, and a second terminal u of the second transistor MN2 is coupled to a first terminal E of the third transistor MP1.

A second terminal D of the third transistor MP1 is coupled to the first interface X, the first terminal E of the third transistor MP1 is coupled to a gate control terminal B of the third transistor MP1, and the gate control terminal B of the third transistor MP1 is coupled to a gate control terminal A of the fourth transistor MP2.

A first terminal z of the fourth transistor MP2 is coupled to the first interface X, and a second terminal p of the fourth transistor MP2 is coupled to the second phase input terminal, where a coupling node is shown as F.

The gate control terminal of the third transistor MP1 is coupled to the gate control terminal of the fourth transistor MP2 to constitute a current mirror structure.

In the circuit shown in FIG. 6, when a first transistor MN1 is not turned on, the second transistor MN2 is also turned off. Therefore, both the two transistors generate leakage currents. For a differential amplifier P, a leakage current of the first transistor MN1 flows from the second phase input terminal of the differential amplifier P to a ground. In the transceiver circuit, in FIG. 6, provided in this application, a leakage current of the second transistor MN2 flows through the third transistor MP1. Due to a mirror action of the third transistor MP1 and the fourth transistor MP2, the leakage current of the second transistor MN2 also flows to the second phase input terminal of the differential amplifier P through the second terminal p of the fourth transistor MP2 and the coupling node F, that is, the leakage current that flows through the fourth transistor MP2 is injected into the second phase input terminal of the differential amplifier P. For the differential amplifier P, the second phase input terminal of the differential amplifier P has both the flowing-out leakage current and the injected leakage current. Therefore, the leakage current injected to the second phase input terminal of the differential amplifier p through the second transistor MN2, the third transistor MP1, and the fourth transistor MP2 may be used as the compensation current, and therefore can be used to cancel, to a specific extent, the leakage current that flows from the second phase input terminal of the differential amplifier P through the first transistor MN1. Therefore, the compensation current that is injected into the second phase input terminal and that is provided in this embodiment of this application may be used to reduce impact of the electric leakage of the first transistor MN1 at the second phase input terminal on output of the differential amplifier P.

According to the circuit provided in FIG. 6, for example, a size ratio of the second transistor MN2 to the first transistor MN1 is 1:K, and K is a positive number greater than 1. In this case, the second transistor MN2 and the third transistor MP1 each have a leakage current that has a value of Ileakage/K and that flows to a ground. If a size ratio of the third transistor MP1 to the fourth transistor MP2 is 1:K, the current mirror that includes the third transistor MP1 and the fourth transistor MP2 amplifies a current by 1:K. Therefore, a leakage current that has a value of Ileakage flows through the fourth transistor MP2, and the leakage current that is of the fourth transistor MP2 and that has the value of Ileakage is injected into the second phase input terminal of the differential amplifier P. In this case, for a leakage current that is of the first transistor MN1, that has a value of Ileakage, and that flows from the second phase input terminal of the differential amplifier P, the leakage current at the second terminal p of the fourth transistor MP2 cancels the leakage current of the first transistor MN1 at the second phase input terminal.

Figure 7:
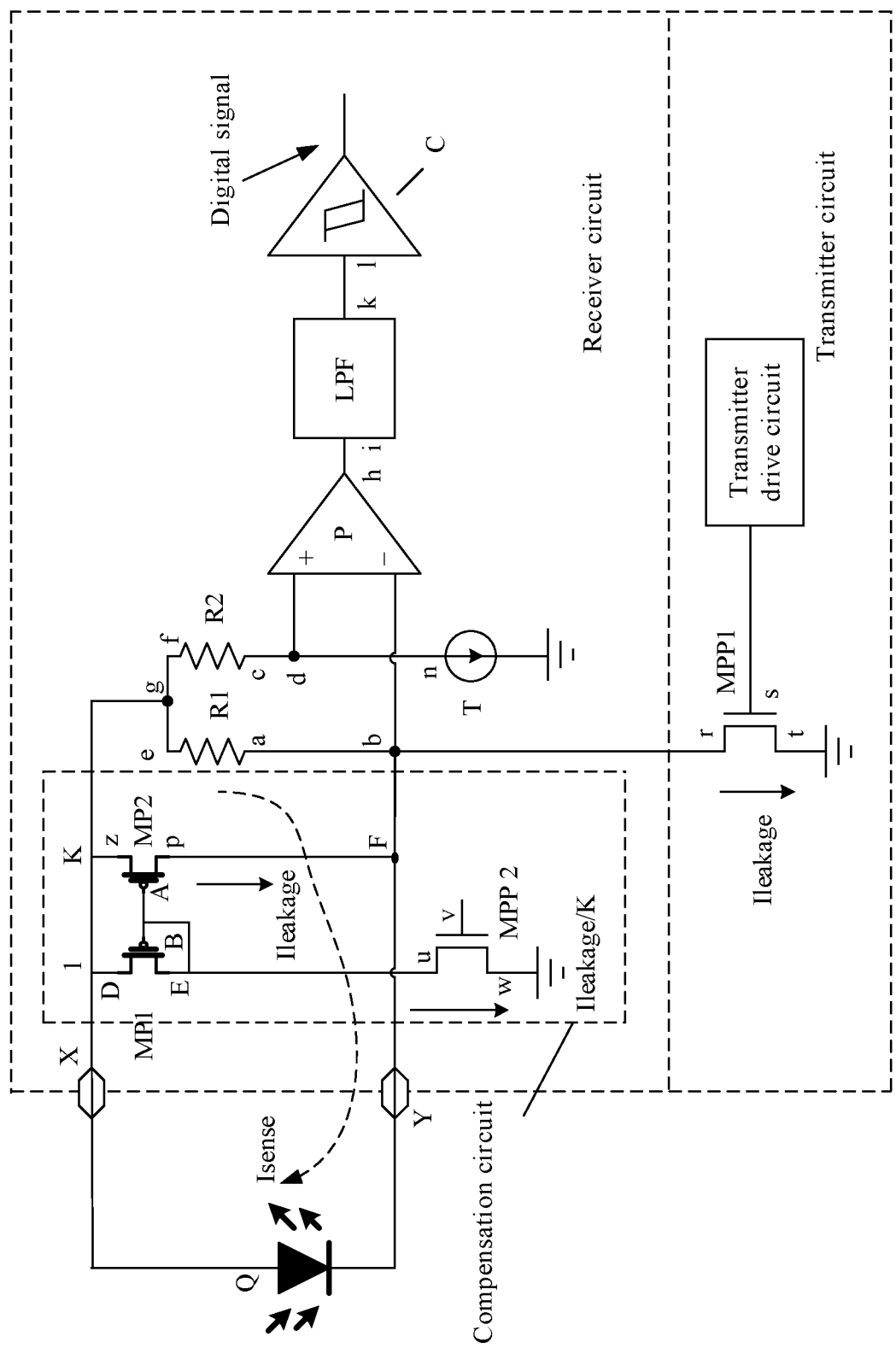
FIG. 7 is a schematic diagram of a transceiver circuit according to an embodiment of this application.

In FIG. 6, the first transistor MN1 and the second transistor MN2 may be NMOS transistors. Certainly, the first transistor MN1 and the second transistor MN2 may alternatively be PMOS transistors. As shown in FIG. 7, a first transistor is shown as MPP1, and a second transistor is shown as MPP2. In this case, a first terminal w of the second transistor MPP2 is coupled to a ground terminal, a gate control terminal v of the second transistor MPP2 is coupled to a first interface X, and a second terminal u of the second transistor MPP2 is coupled to a first terminal E of a third transistor MP1.

It may be learned from the foregoing embodiments that, in this application, the compensation circuit is introduced to handle a case that electric leakage of the first transistor MN1 affects a voltage of the second phase input terminal of the differential amplifier, affecting accuracy of the infrared receiver circuit. The compensation circuit may introduce a leakage path at the first phase input terminal of the differential amplifier, or introduce an electric leakage compensation current in an opposite direction at the second phase input terminal of the differential amplifier, to reduce impact of the non-ideal characteristic of the first transistor MN1 on the differential amplifier. In addition, compared with a circuit provided in the conventional technology, the layout area of the circuit is reduced, thereby reducing costs.

Figure 8:
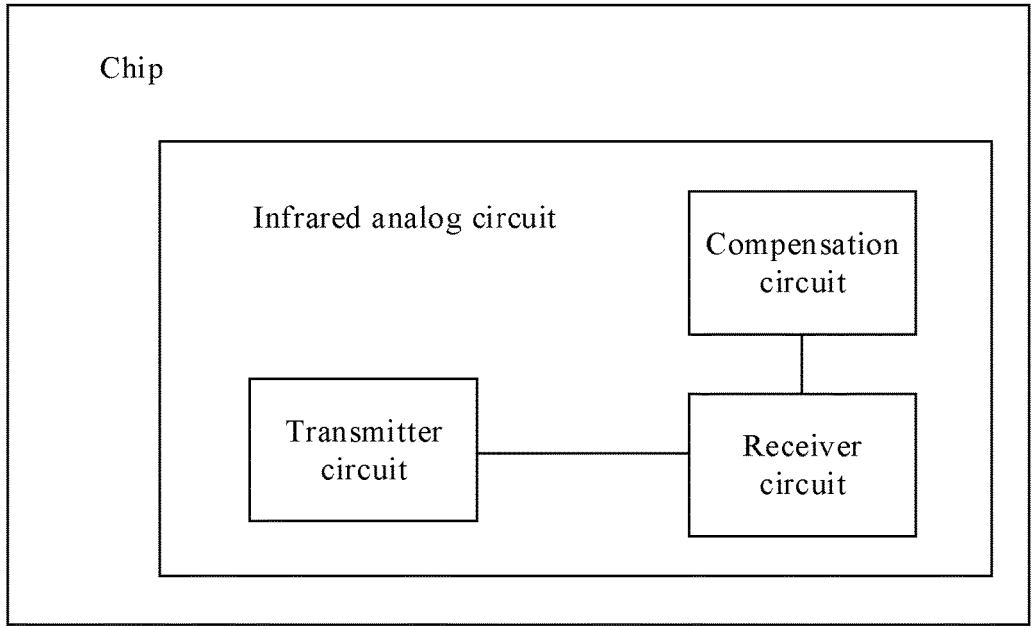
FIG. 8 is a schematic diagram of a structure of a chip according to an embodiment of this application.

An embodiment of this application further provides a chip. As shown in FIG. 8, any one of the transceiver circuits corresponding to FIG. 2, FIG. 3, FIG. 4, FIG. 5, FIG. 6, and FIG. 7 may be integrated into the chip, that is, the transmitter circuit, the receiver circuit, and the compensation circuit in the foregoing embodiments of this application are integrated into the chip, such that when the transmitter circuit and the receiver circuit work, impact of a leakage current of a transistor in the transmitter circuit on the receiver circuit can be reduced.

Figure 9:
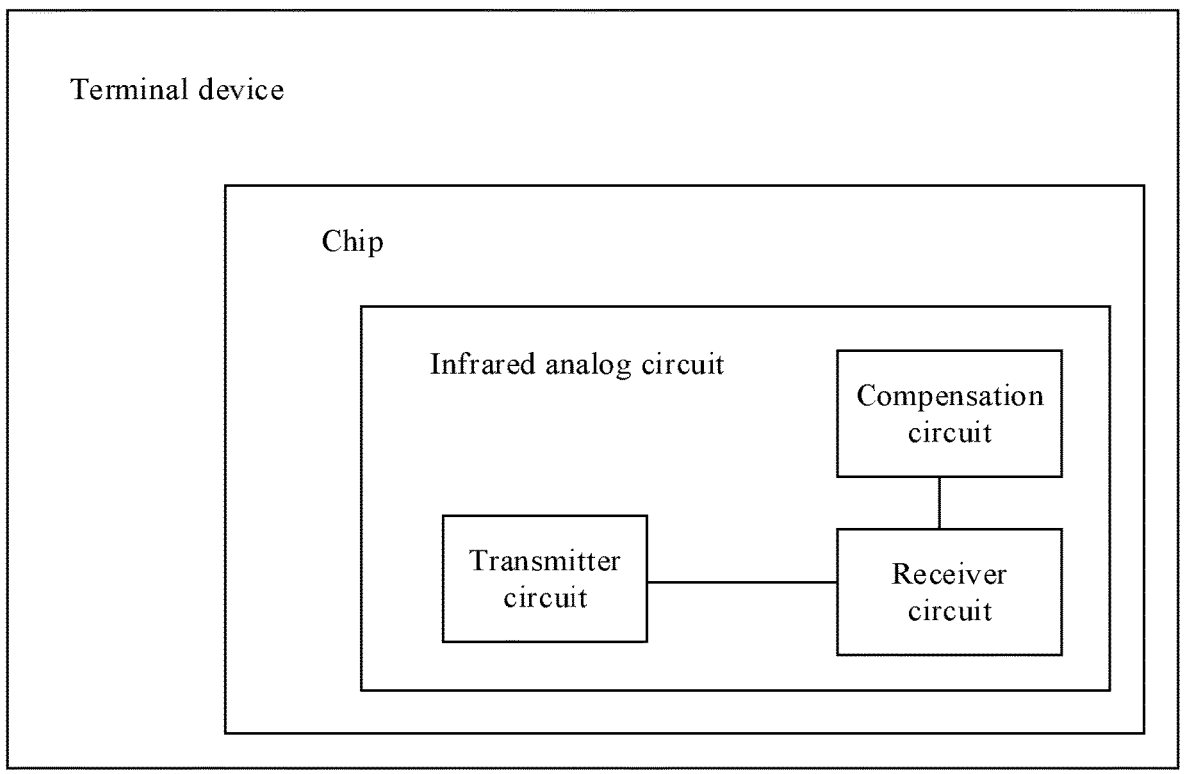
FIG. 9 is a schematic diagram of a structure of a terminal device according to an embodiment of this application.

An embodiment of this application further provides a terminal device. As shown in FIG. 9, the terminal device may be a device such as a mobile phone or a tablet computer. The terminal device may include the chip shown in FIG. 8. The terminal device may be used as a remote control apparatus to control various electric appliances in a home, or may learn a function that is of a remote control of an electric appliance and that is used when the remote control remotely controls the electric appliance.

The foregoing descriptions are merely example implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A transceiver circuit, comprising:
   a first interface configured to connect to an optical transceiver device;
   a second interface configured to connect to the optical transceiver device;
   a receiver circuit connected to the first interface and the second interface, wherein the receiver circuit comprises a differential amplifier including a first phase input terminal coupled to the first interface and a second phase input terminal coupled to the second interface;
   a transmitter circuit connected to the first interface and the second interface, wherein the transmitter circuit comprises a first transistor including a first primary terminal coupled to the second phase input terminal and a first secondary terminal configured to couple to a first ground terminal; and
   a compensation circuit connected to the first interface and the second interface,
   wherein the compensation circuit is configured to provide a compensation current for the second phase input terminal,
   wherein the compensation circuit comprises a second transistor and a current mirror,
   wherein the second transistor is coupled to a second ground terminal, and
   wherein the current mirror is configured to:
      receive a leakage current passing through the second transistor; and
      output the compensation current to the second phase input terminal.

2. The transceiver circuit of claim 1, further comprising a transmitter drive circuit configured to control turning the first transistor on and off.

3. The transceiver circuit of claim 1, wherein the second transistor is disposed between the first interface and the second ground terminal.

4. The transceiver circuit of claim 1, wherein the second transistor is the same as the first transistor.

5. The transceiver circuit of claim 3, wherein the current mirror comprises:
   a third transistor disposed between the first interface and the second transistor; and
   a fourth transistor disposed between the first interface and the second phase input terminal.

6. The transceiver circuit of claim 3, wherein the current mirror copies or amplifies the leakage current to obtain the compensation current.

7. The transceiver circuit of claim 1, wherein a second primary terminal of the second transistor is coupled to the second ground terminal, wherein a first current terminal of the current mirror is coupled to a second secondary terminal of the second transistor, wherein a second current terminal of the current mirror is coupled to the second phase input terminal, wherein the second transistor is configured to provide a leakage current that flows to the second ground terminal, wherein the current mirror is configured to amplify the leakage current to obtain the compensation current, and wherein the compensation current is injected into the second phase input terminal.

8. The transceiver circuit of claim 7, wherein the second primary terminal and a second gate control terminal of the second transistor are coupled to the second ground terminal, and wherein the second secondary terminal is coupled to a third primary terminal of the third transistor.

9. The transceiver circuit of claim 8, wherein the second primary terminal is coupled to the second ground terminal, wherein a second gate control terminal of the second transistor is coupled to the first interface, and wherein the second secondary terminal is coupled to a third primary terminal of the third transistor.

10. The transceiver circuit of claim 9, wherein a third secondary terminal of the third transistor is coupled to the first interface, wherein the third primary terminal is coupled to a third gate control terminal of the third transistor, and wherein the third gate control terminal is coupled to a fourth gate control terminal of the fourth transistor.

11. The transceiver circuit of claim 10, wherein a fourth primary terminal of the fourth transistor is coupled to the first interface, and wherein a fourth secondary terminal of the fourth transistor is coupled to the second phase input terminal.

12. A chip, comprising:
   a transceiver circuit, comprising:
      a first interface configured to connect to an optical transceiver device;
      a second interface configured to connect to the optical transceiver device;
      a receiver circuit connected to the first interface and the second interface, wherein the receiver circuit comprises a differential amplifier including a first phase input terminal coupled to the first interface and a second phase input terminal coupled to the second interface;

a transmitter circuit connected to the first interface and the second interface, wherein the transmitter circuit comprises a first transistor including a first primary terminal coupled to the second phase input terminal and a first secondary terminal configured to couple to a first ground terminal; and a compensation circuit connected to the first interface and the second interface, wherein the compensation circuit is configured to provide a compensation current for the second phase input terminal, wherein the compensation circuit comprises a second transistor and a current mirror, wherein the second transistor is coupled to a second ground terminal, and wherein the current mirror is configured to receive a leakage current passing through the second transistor and output the compensation current to the second phase input terminal.

13. The chip of claim 12, wherein the second transistor is disposed between the first interface and the second ground terminal.

14. The chip of claim 13, wherein the current mirror comprises:
a third transistor disposed between the first interface and the second transistor; and
a fourth transistor disposed between the first interface and the second phase input terminal.

15. The chip of claim 13, wherein the current mirror copies or amplifies the leakage current to obtain the compensation current.

16. The chip of claim 12, wherein a second primary terminal of the second transistor is coupled to the second ground terminal, wherein a first current terminal of the current mirror is coupled to a second secondary terminal of the second transistor, wherein a second current terminal of the current mirror is coupled to the second phase input terminal, wherein the second transistor is configured to provide a leakage current that flows to the second ground terminal, wherein the current mirror is configured to amplify the leakage current to obtain the compensation current, and wherein the compensation current is injected into the second phase input terminal.

17. A terminal device, comprising:
a transceiver circuit, comprising:
a first interface configured to connect to an optical transceiver device;
a second interface configured to connect to the optical transceiver device;
a receiver circuit connected to the first interface and the second interface, wherein the receiver circuit comprises a differential amplifier including a first phase input terminal coupled to the first interface and a second phase input terminal coupled to the second interface;
a transmitter circuit connected to the first interface and the second interface, wherein the transmitter circuit comprises a first transistor including a first primary terminal coupled to the second phase input terminal and a first secondary terminal configured to couple to a first ground terminal; and
a compensation circuit connected to the first interface and the second interface,
wherein the compensation circuit is configured to provide a compensation current for the second phase input terminal,
wherein the compensation circuit comprises a second transistor and a current mirror,
wherein the second transistor is coupled to a second ground terminal, and
wherein the current mirror is configured to receive a leakage current passing through the second transistor and output the compensation current to the second phase input terminal.

18. The terminal device of claim 17, wherein the second transistor is disposed between the first interface and the second ground terminal.

19. The terminal device of claim 18, wherein the current mirror comprises:
a third transistor disposed between the first interface and the second transistor; and
a fourth transistor disposed between the first interface and the second phase input terminal.

20. The terminal device of claim 18, wherein the current mirror copies or amplifies the leakage current to obtain the compensation current.

* * * * *